United States Patent
Go (10) Patent No.: US 11,322,386 B2
(45) Date of Patent: May 3, 2022

(54) TRANSFER APPARATUS

(71) Applicant: DISCO CORPORATION, Tokyo (JP)

(72) Inventor: Bin Go, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 143 days.

(21) Appl. No.: 16/802,855

(22) Filed: Feb. 27, 2020

(65) Prior Publication Data

US 2020/0294840 A1    Sep. 17, 2020

(30) Foreign Application Priority Data

Mar. 13, 2019 (JP) .............................. JP2019-046318

(51) Int. Cl.
*B32B 43/00* (2006.01)
*H01L 21/683* (2006.01)
*B25J 15/06* (2006.01)
*B32B 38/10* (2006.01)

(52) U.S. Cl.
CPC ...... *H01L 21/6838* (2013.01); *B25J 15/0616* (2013.01); *B32B 38/10* (2013.01); *B32B 43/006* (2013.01); *Y10T 156/1132* (2015.01); *Y10T 156/1944* (2015.01)

(58) Field of Classification Search
CPC ......... Y10T 156/1132; Y10T 156/1944; H01L 21/6838; B32B 43/006; B32B 38/10
See application file for complete search history.

(56) References Cited

U.S. PATENT DOCUMENTS

2020/0039092 A1    2/2020    Reinhold et al.

FOREIGN PATENT DOCUMENTS

| JP | 2004119784 A | 4/2004 |
|---|---|---|
| JP | 2012000706 A | 1/2012 |
| WO | 2018059776 A1 | 4/2018 |

OTHER PUBLICATIONS

Translation of WO 2018/059776 spec (Year: 2018).*
Search report issued in corresponding Singapore application No. 10202001232X, dated Mar. 10, 2021.

* cited by examiner

*Primary Examiner* — Philip C Tucker
*Assistant Examiner* — Nickolas R Harm
(74) *Attorney, Agent, or Firm* — Greer, Burns & Crain, Ltd.

(57) ABSTRACT

A transfer apparatus holdes a plate-shaped workpiece under suction in a noncontact condition and transfers the workpiece. The transfer apparatus includes a base, a Bernoulli transfer pad fixed to the base for spraying air toward the workpiece to produce a vacuum, and a moving unit for moving the base. The Bernoulli transfer pad includes a cylindrical pad body. The pad body has a lower surface as a holding surface to which a fluid spraying portion opens and an annular pad mounting portion for mounting an annular pad. When the annular pad is mounted on the annular pad mounting portion, the holding surface is increased in a radial direction of the pad body to thereby increase a suction force for sucking the workpiece.

5 Claims, 6 Drawing Sheets

FIG.9

TRANSFER APPARATUS

BACKGROUND OF THE INVENTION

Field of the Invention

The present invention relates to a transfer apparatus for transferring a plate-shaped workpiece such as a semiconductor wafer.

Description of the Related Art

In processing a wafer such as a semiconductor wafer, the wafer is generally transferred in the condition where the wafer is held under suction by a vacuum pad. In transferring the wafer, there arises a problem that when the vacuum pad comes into contact with a front side of the wafer on which devices are formed, the devices may be damaged. To cope with this problem, there has been proposed a transfer apparatus including a Bernoulli transfer pad capable of sucking the wafer in a noncontact condition (see Japanese Patent Laid-Open No. 2004-119784, for example).

SUMMARY OF THE INVENTION

However, there is a case that the wafers to be transferred have different weights according to the size and thickness. In such a case, the Bernoulli transfer pad in the transfer apparatus described in Japanese Patent Laid-Open No. 2004-119784 must be replaced according to the wafers having different weights, so as to suitably change the suction force of the Bernoulli transfer pad. Accordingly, the transfer apparatus described in Japanese Patent Laid-Open No. 2004-119784 has a problem that a considerable cost and time for changing the suction force of the Bernoulli transfer pad are required.

It is therefore an object of the present invention to provide a transfer apparatus which can suppress the cost and time for changing the suction force of the Bernoulli transfer pad.

In accordance with an aspect of the present invention, there is provided a transfer apparatus for holding a plate-shaped workpiece under suction in a noncontact condition and transferring the plate-shaped workpiece, the transfer apparatus including a base; a Bernoulli transfer pad fixed to the base for spraying a fluid toward the workpiece to produce a vacuum; and a moving unit for moving the base; the Bernoulli transfer pad including a cylindrical pad body, the pad body having a first holding surface to which a fluid spraying portion opens and an annular pad mounting portion for mounting an annular pad, whereby when the annular pad is mounted on the annular pad mounting portion, the first holding surface is increased in a radial direction of the pad body to thereby increase a suction force for sucking the workpiece.

Preferably, the annular pad mounting portion is formed by a cylindrical outer surface of the pad body; and the Bernoulli transfer pad further includes an annular pad mounted to the pad body, the annular pad having an inner diameter equal to a diameter of the pad body and a second holding surface flush with the first holding surface on a radially outside of the pad body.

Preferably, the annular pad includes a plurality of annular pads having different outer diameters; a selected one of the plurality of annular pads being mounted on the cylindrical outer surface of the pad body.

The transfer apparatus of the present invention has an effect that a cost and time for changing the suction force of the Bernoulli transfer pad can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, configurations described below may be suitably combined. Further, the configurations may be suitably omitted, replaced, or changed without departing from the scope of the present invention.

Figure 1:
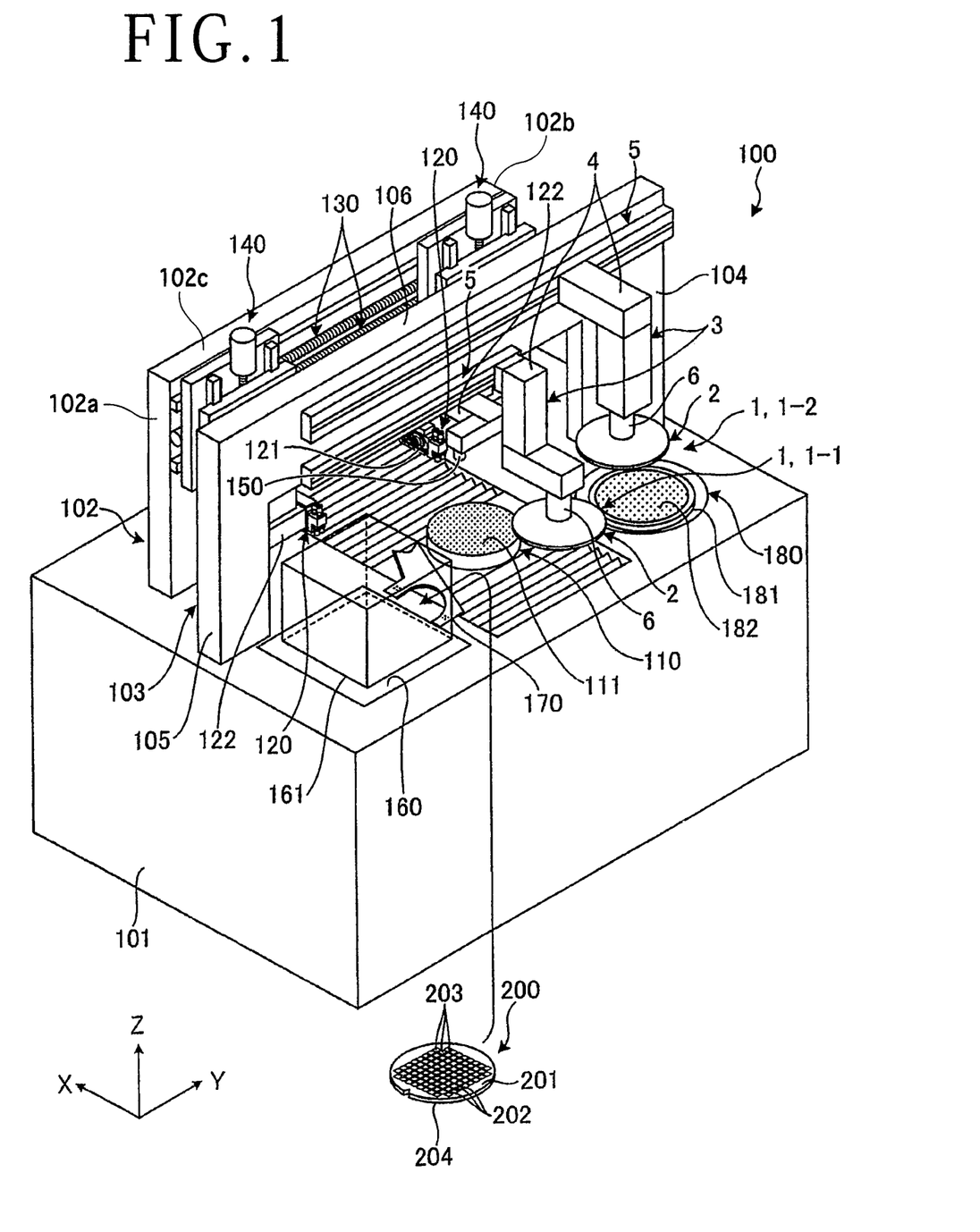
FIG. 1 is a perspective view depicting a configuration of a processing apparatus including a transfer apparatus according to a preferred embodiment of the present invention.
Figure 2:
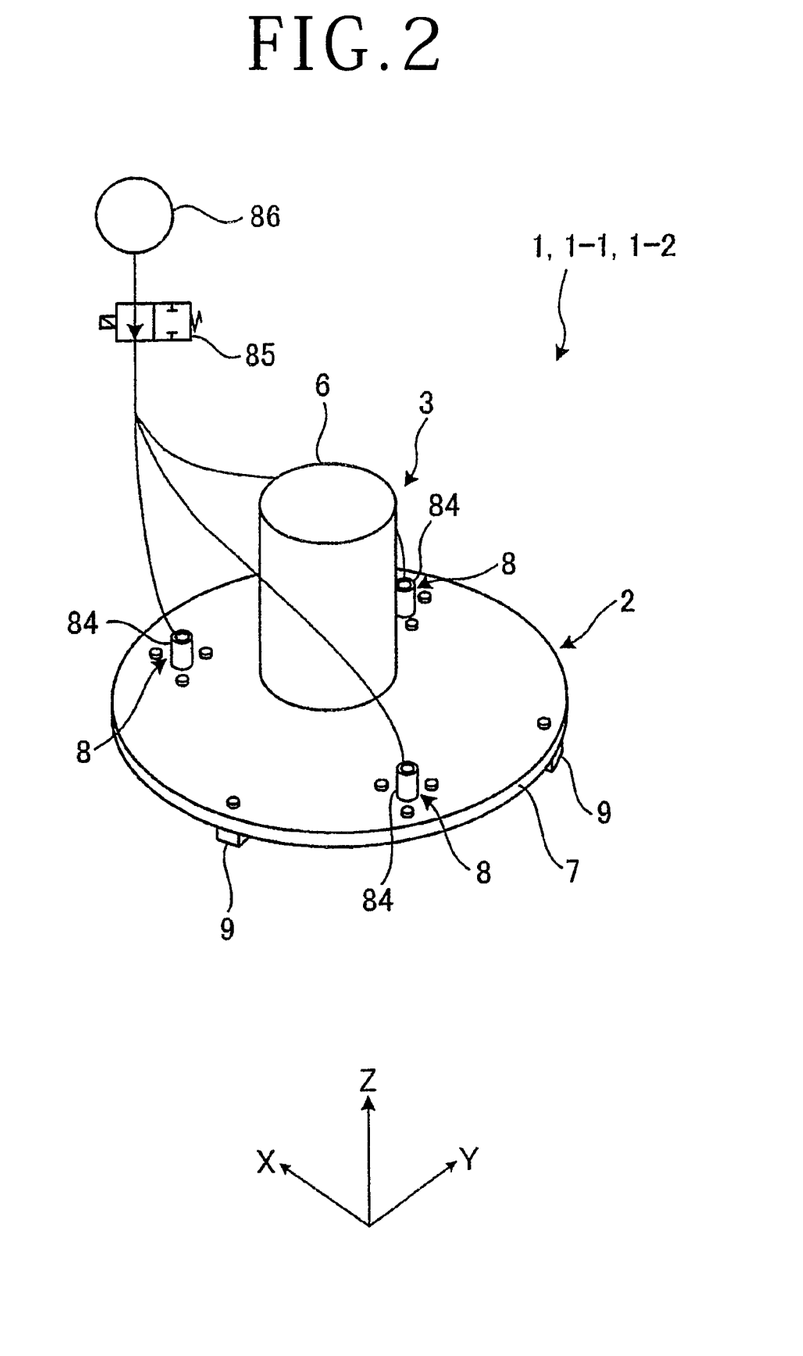
FIG. 2 is a perspective view depicting a configuration of the transfer apparatus according to this preferred embodiment.
Figure 3:
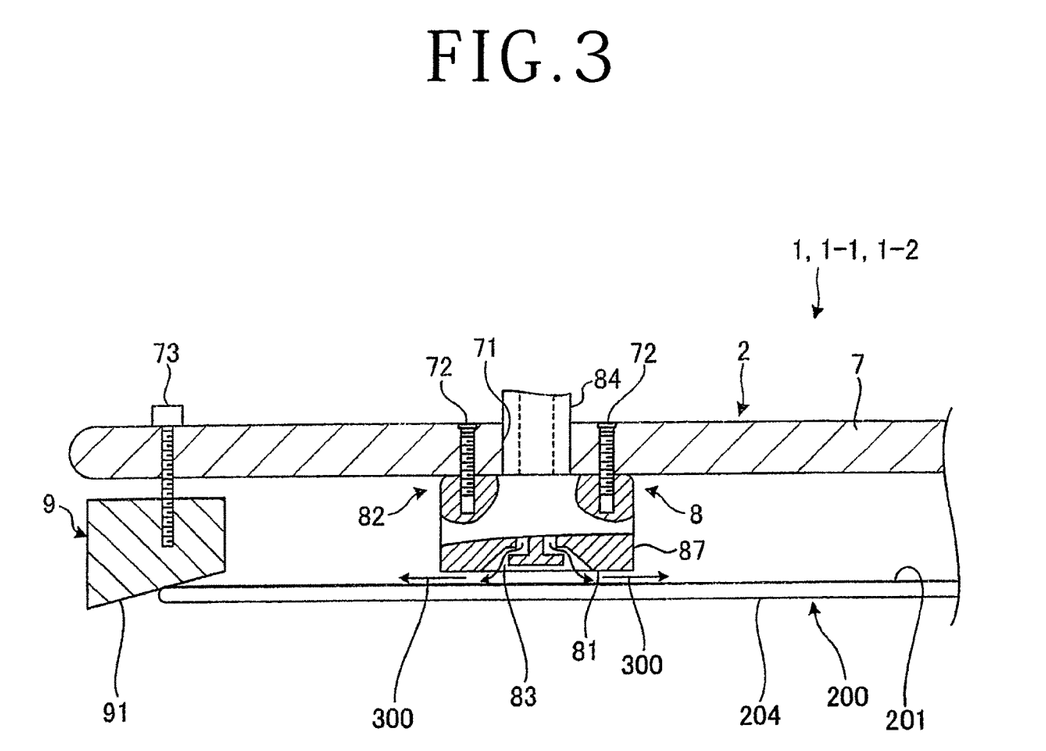
FIG. 3 is a sectional view of an essential part of the transfer apparatus depicted in FIG. 2 in a condition where a workpiece is held under suction in a noncontact condition by the transfer apparatus.

A transfer apparatus according to a preferred embodiment of the present invention will now be described with reference to the drawings. FIG. 1 is a perspective view depicting a configuration of a processing apparatus including the transfer apparatus according to this preferred embodiment. FIG. 2 is a perspective view depicting a configuration of the transfer apparatus according to this preferred embodiment. FIG. 3 is a sectional view of an essential part of the transfer apparatus depicted in FIG. 2 in a condition where a workpiece is held under suction by the transfer apparatus in a noncontact condition such that the upper surface of the workpiece is not contact with the lower surface of the transfer apparatus.

In FIG. 1, reference numeral 100 denotes a processing apparatus including a pair of transfer apparatuses 1 according to this preferred embodiment. The pair of transfer apparatuses 1 has the same configuration. The processing apparatus 100 is a cutting apparatus for cutting a plate-shaped workpiece 200.

In this preferred embodiment, the workpiece 200 is a disk-shaped wafer such as a semiconductor wafer and an optical device wafer. The wafer is formed of silicon, sapphire, or gallium arsenide, for example, as a base material. The workpiece 200 has a front side 201 on which a plurality of crossing division lines 202 are formed to define a plurality of rectangular separate regions where a plurality of devices 203 are respectively formed. Further, while the workpiece 200 in this preferred embodiment is a wafer such as a semiconductor wafer and an optical device wafer, the workpiece usable in the present invention is not limited to a wafer.

The processing apparatus 100 depicted in FIG. 1 is an apparatus for cutting the workpiece 200 to divide it into the individual devices 203 (device chips). As depicted in FIG. 1, the processing apparatus 100 includes a chuck table 110 having a holding surface 111 for holding the workpiece 200 under suction, a pair of cutting units 120 as processing units for cutting the workpiece 200 held on the chuck table 110, and the pair of transfer apparatuses 1 for transferring the workpiece 200.

The processing apparatus 100 depicted in FIG. 1 further includes an X moving unit (not depicted) for moving the chuck table 110 in the X direction depicted by an arrow X in FIG. 1, a pair of Y moving units 130 for respectively moving the pair of cutting units 120 in the Y direction depicted by an arrow Y in FIG. 1, a pair of Z moving units 140 for respectively moving the pair of cutting units 120 in the Z direction depicted by an arrow Z in FIG. 1, and a control apparatus (not depicted) for controlling the X moving unit, the pair of Y moving units 130, and the pair of Z moving units 140. The X direction and the Y direction are perpendicular to each other in a horizontal plane. The Z direction is perpendicular to this horizontal plane, that is, the Z direction is a vertical direction perpendicular to both the X direction and the Y direction. Thus, the X direction is a horizontal direction, and the Y direction is another horizontal direction perpendicular to this horizontal direction. As depicted in FIG. 1, the processing apparatus 100 is a two-spindle type dicing saw, or what is called facing dual type cutting apparatus including the two cutting units 120.

The workpiece 200 has a back side 204 opposite to the front side 201. The back side 204 of the workpiece 200 is adapted to be held on the holding surface 111 of the chuck table 110 under suction. The chuck table 110 is a disk-shaped member, and the holding surface 111 for holding the workpiece 200 under suction is formed of porous ceramic, for example. The chuck table 110 is movable in the X direction by the X moving unit so as to be moved between a processing area below each cutting unit 120 and a standby area set apart from the processing area in the X direction. In the processing area, the workpiece 200 held on the chuck table 110 is cut by each cutting unit 120. In the standby area, the workpiece 200 to be cut is loaded to the chuck table 110, and the workpiece 200 cut is unloaded from the chuck table 110. Further, the chuck table 110 is rotatable by a rotational drive source (not depicted) so as to be rotated about a vertical axis extending in the Z direction. The chuck table 110 is connected to a vacuum source (not depicted), so that a suction force produced by the vacuum source is applied to the holding surface 111 of the chuck table 110 to thereby hold the workpiece 200 on the holding surface 111 under suction.

Each cutting unit 120 includes a spindle (not depicted) on which a cutting blade 121 is mounted to cut the workpiece 200 held on the chuck table 110. The spindle has a rotation axis extending in the Y direction. Each cutting unit 120 is movable in the Y direction by the corresponding Y moving unit 130, so that each cutting blade 121 is movable in the Y direction relative to the workpiece 200 held on the chuck table 110. Each cutting unit 120 is also movable in the Z direction by the corresponding Z moving unit 140, so that each cutting blade 121 is movable in the Z direction relative to the workpiece 200 held on the chuck table 110.

As depicted in FIG. 1, the processing apparatus 100 has a box-shaped base housing 101, and the two cutting units 120 are supported to a double column type first support frame 102 composed of two columns 102a and 102b provided on the upper surface of the base housing 101 and a horizontal bar 102c connecting the upper ends of the two columns 102a and 102b. One of the two cutting units 120 is supported through the corresponding Y moving unit 130 and the corresponding Z moving unit 140 to the column 102a, and the other cutting unit 120 is supported through the corresponding Y moving unit 130 and the corresponding Z moving unit 140 to the column 102b.

Each cutting unit 120 is adapted to be moved by the corresponding moving unit 130 and the corresponding Z moving unit 140 to thereby set the corresponding cutting blade 121 at any position above the holding surface 111 of the chuck table 110, that is, at any horizontal position and vertical position above the holding surface 111. Each cutting unit 120 includes a spindle housing 122 movable in the Y direction by the corresponding Y moving unit 130 and also movable in the Z direction by the corresponding Z moving unit 140. Each spindle (not depicted) on which the corresponding cutting blade 121 is mounted is rotatably supported to the corresponding spindle housing 122. A motor (not depicted) for rotating each spindle is provided in each spindle housing 122. Each cutting blade 121 is an annular cutting wheel formed from abrasive and having a very small thickness.

The processing apparatus 100 further includes an imaging unit 150 for imaging the workpiece 200 held on the holding surface 111 of the chuck table 110. In this preferred embodiment, the imaging unit 150 is mounted on one of the two cutting units 120 and adapted to be moved together with the cutting unit 120. The imaging unit 150 includes a charge-coupled device (CCD) camera for imaging a target area of the workpiece 200 to be divided in the condition where the workpiece 200 is held on the chuck table 110. The CCD camera functions to image the workpiece 200 held on the chuck table 110 and thereby obtain an image for use in performing alignment between the workpiece 200 and the cutting blade 121. This image obtained by the imaging unit 150 is output to the control apparatus.

Each of the X moving unit, the Y moving units 130, and the Z moving units 140 includes a known ball screw rotatable about its axis, a known pulse motor for rotating the ball screw about its axis, and a pair of known guide rails for supporting the chuck table 110 or each cutting unit 120 so as to allow the movement thereof in the X direction, the Y direction, or the Z direction.

The processing apparatus 100 further includes a cassette elevator 160 for mounting a cassette 161 and moving it in the Z direction, a cleaning apparatus 180 for cleaning the workpiece 200 after cutting, and a handling unit 170 for taking the workpiece 200 out of the cassette 161 before cutting and storing the workpiece 200 into the cassette 161 after cutting. The cassette 161 can store a plurality of workpieces 200 before and after cutting. The cleaning apparatus 180 includes a chuck table 181 having a holding surface 182 for holding the workpiece 200 thereon under suction after cutting, in which the workpiece 200 held on the chuck table 181 is cleaned after cutting.

The control apparatus functions to control each component mentioned above and perform a cutting operation to the workpiece 200 in the processing apparatus 100. The control apparatus includes a computer system. For example, the control apparatus includes a computing apparatus having a microprocessor such as central processing unit (CPU), a storage apparatus having a memory such as read only memory (ROM) and random access memory (RAM), and an input/output interface apparatus. The computing apparatus functions to perform computing according to a computer program stored in the storage apparatus and output a control signal through the input/output interface apparatus to each component of the processing apparatus 100, thereby controlling the processing apparatus 100. Although not depicted, the control apparatus is also connected to display means such as a liquid crystal display for displaying an operational condition, an image, etc. and input means to be used by an operator in recording information on cutting operation. Examples of the input means include a touch panel provided on the display means and a keyboard.

While the processing apparatus 100 is a cutting apparatus in this preferred embodiment, the processing apparatus in the present invention is not limited to a cutting apparatus, and may be a cleaning apparatus, a laser processing apparatus, or a grinding apparatus, for example. While the cutting unit 120 is depicted as a processing unit in this preferred embodiment, the processing unit in the present invention is not limited to the cutting unit 120, and may be a cleaning unit, a laser beam applying unit, or a grinding unit, for example.

As depicted in FIG. 1, one of the two transfer apparatuses 1 functions to load the workpiece 200 to the holding surface 111 of the chuck table 110 or unload the workpiece 200 from the holding surface 111. The other transfer apparatus 1 functions to load the workpiece 200 to the holding surface 182 of the chuck table 181 or unload the workpiece 200 from the holding surface 182. More specifically, one of the two transfer apparatuses 1 in this preferred embodiment is a first transfer apparatus 1-1 for transferring the workpiece 200 between the handling unit 170 and the chuck table 110, and the other transfer apparatus 1 is a second transfer apparatus 1-2 for transferring the workpiece 200 between the chuck table 110 and the chuck table 181 of the cleaning apparatus 180. That is, the first transfer apparatus 1-1 functions to transfer the workpiece 200 from the handling unit 170 to the chuck table 110 before cutting. The second transfer apparatus 1-2 functions to transfer the workpiece 200 from the chuck table 110 to the chuck table 181 of the cleaning apparatus 180 after cutting. The first transfer apparatus 1-1 also functions to transfer the workpiece 200 from the chuck table 181 of the cleaning apparatus 180 to the handling unit 170 after cleaning.

As depicted in FIG. 3, each of the first and second transfer apparatuses 1-1 and 1-2 includes a Bernoulli transfer pad 8 having a lower surface 81 to be opposed to the front side 201 of the workpiece 200. That is, each of the first and second transfer apparatuses 1-1 and 1-2 is so configured as to spray air 300 as a fluid along the lower surface 81 of the Bernoulli transfer pad 8 and thereby produce a vacuum at a central portion of the lower surface 81, thereby holding the workpiece 200 under suction. Further, a repulsive force is produced by the air 300 flowing between the workpiece 200 and the lower surface 81, thereby preventing the contact between the workpiece 200 and the lower surface 81, so that the workpiece 200 can be held and transferred in a noncontact condition.

As depicted in FIGS. 1 and 2, each of the first and second transfer apparatuses 1-1 and 1-2 includes a holding unit 2 for holding the workpiece 200 under suction in a noncontact condition and a moving unit 3 for moving the holding unit 2. The moving unit 3 includes a support arm 4 for supporting the holding unit 2, a Y moving mechanism 5 for moving the support arm 4 (i.e., the holding unit 2) in the Y direction, and a Z moving mechanism 6 for moving the holding unit 2 in the Z direction. One end of the support arm 4 is connected to the Y moving mechanism 5, and the other end of the support arm 4 is connected to the Z moving mechanism 6. A double column type second support frame 103 is provided on the front side of the first support frame 102 near the standby area in the X direction. The second support frame 103 is composed of two columns 104 and 105 provided on the upper surface of the base housing 101 and a horizontal bar 106 connecting the upper ends of the two columns 104 and 105. The two Y moving mechanisms 5 for respectively moving the two support arms 4 are provided on the horizontal bar 106 of the second support frame 103. Each Y moving mechanism 5 is composed of a known ball screw rotatable about its axis, a known pulse motor for rotating the ball screw about its axis, and a known guide rail for supporting the corresponding support arm 4 so as to allow the movement of the support arm 4 in the Y direction. Each Z moving mechanism 6 is configured by a known air cylinder having a rod movable in the Z direction.

As depicted in FIGS. 2 and 3, each holding unit 2 includes a disk-shaped base 7, three Bernoulli transfer pads 8 mounted on the base 7, and three edge support members 9 fixed to the base 7. The base 7 is mounted at its central portion to the lower end of the rod of the Z moving mechanism 6 of the corresponding moving unit 3. Accordingly, the base 7 is movable in the Y direction and the Z direction by the corresponding moving unit 3. Each Bernoulli transfer pad 8 is fixed to the lower surface of the base 7.

Each Bernoulli transfer pad 8 is fixed to the base 7 and so configured as to spray air 300 to the workpiece 200 and thereby produce a vacuum at the center of the lower surface 81 as a first holding surface. In this preferred embodiment, the three Bernoulli transfer pads 8 are fixed to the base 7 and arranged at equal intervals in the circumferential direction of the base 7. Each Bernoulli transfer pad 8 includes a cylindrical pad body 82, a fluid spraying portion 83 for spraying the air 300 as a fluid from the central portion of the lower surface 81 of the pad body 82 along the lower surface 81, and a communication pipe 84 having a lower end connected to the upper surface of the pad body 82 so as to communicate with the fluid spraying portion 83. The pad body 82 of each Bernoulli transfer pad 8 is formed of metal (e.g., stainless steel) or synthetic resin.

The pad body 82 has the lower surface 81 to which the fluid spraying portion 83 opens. The lower surface 81 is a flat surface extending in a horizontal direction. The communication pipe 84 is a cylindrical pipe projecting from the center of the upper surface of the pad body 82. As depicted in FIG. 2, the upper end of each communication pipe 84 is connected through an on-off valve 85 to a pressurized air source 86 as a fluid source. The communication pipe 84 in each Bernoulli transfer pad 8 is inserted through a through hole 71 formed in the base 7 as depicted in FIG. 3 in such a manner that the upper surface of the pad body 82 comes into contact with the lower surface of the base 7. In this condition, a plurality of bolts 72 are inserted though the base 7 and screwed into the pad body 82, thereby fixing the pad body 82 to the base 7.

Accordingly, in the operation of each Bernoulli transfer pad 8, the air 300 is supplied from the pressurized air source 86 through each communication pipe 84 to each fluid spraying portion 83 and then sprayed from each fluid spraying portion 83 along the lower surface 81 of each pad body 82. As a result, a vacuum is produced at the central portion of the lower surface 81 of each pad body 82, thereby holding the workpiece 200 under suction. At this time, the workpiece 200 approaches the lower surface 81 of each pad body 82 due to the vacuum produced. However, the air 300 flowing between the lower surface 81 of each pad body 82 and the workpiece 200 applies a repulsive force to the workpiece 200. As a result, the contact between the workpiece 200 and the lower surface 81 of each pad body 82 can be prevented, and the workpiece 200 can be held under suction in a noncontact condition as depicted in FIG. 3.

Each edge support member 9 is fixed to the base 7 and functions to come into contact with the outer edge of the workpiece 200, thereby restricting the horizontal movement of the workpiece 200. In this preferred embodiment, the three edge support members 9 are arranged at equal intervals in the circumferential direction of the base 7 as depicted in FIG. 2 (one of the three edge support members 9 being not depicted). Each edge support member 9 is interposed between any adjacent ones of the three Bernoulli transfer pads 8 arranged at equal intervals in the circumferential direction of the base 7. Further, each edge support member 9 is located radially outside of each Bernoulli transfer pad 8 in the radial direction of the base 7. A bolt 73 is inserted through the base 7 from the upper side thereof and screwed into each edge support member 9, thereby fixing each edge support member 9 to the base 7 on the lower side thereof. Each edge support member 9 has a lower surface 91 inclined gradually upward toward the center of the base 7. The inclined lower surface 91 of each edge support member 9 functions to come into contact with the outer edge of the workpiece 200, thereby preventing the horizontal movement of the workpiece 200 held by each Bernoulli transfer pad 8 under suction in a noncontact condition.

Figure 4:
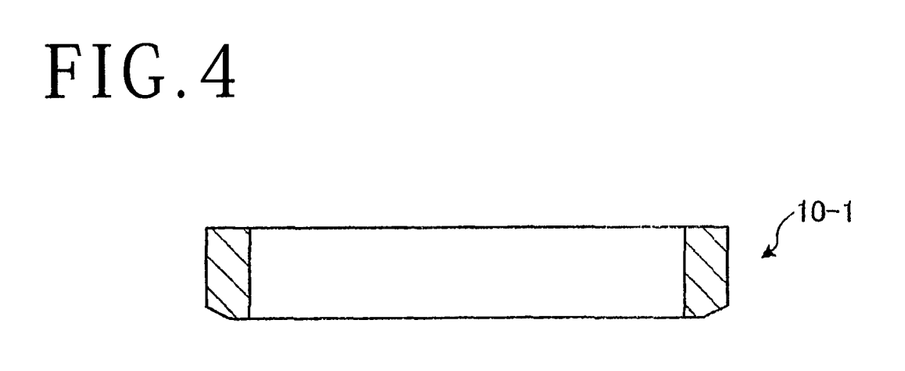
FIG. 4 is a sectional view of an annular pad adapted to be mounted to a pad body of a Bernoulli transfer pad included in the transfer apparatus depicted in FIG. 2.
Figure 5:
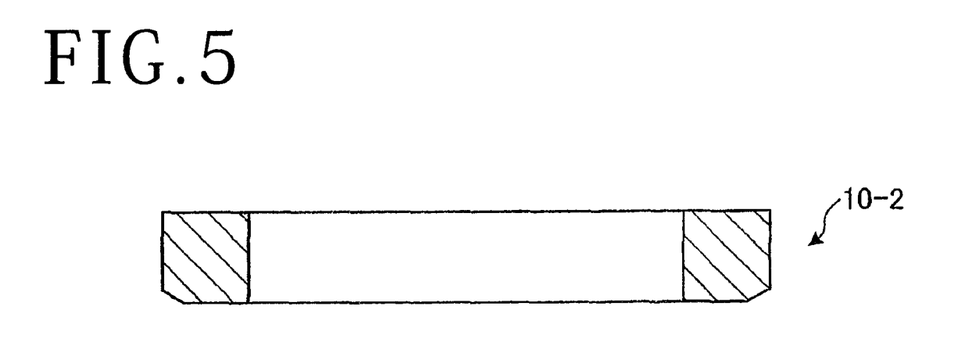
FIG. 5 is a view similar to FIG. 4, depicting another annular pad larger in an outer diameter than the annular pad depicted in FIG. 4.
Figure 6:
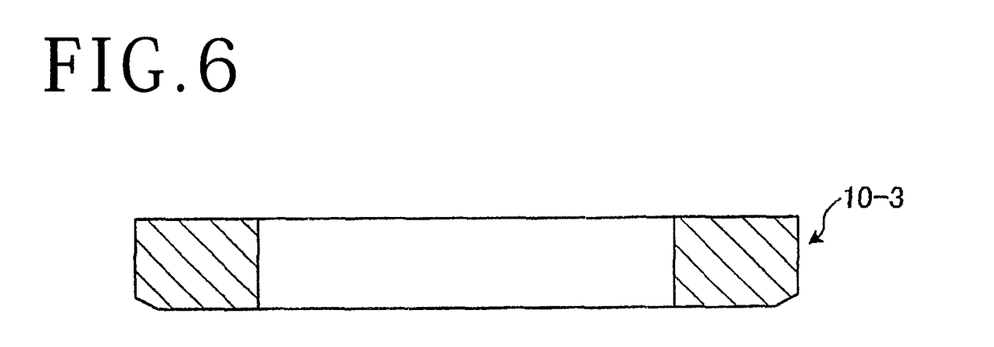
FIG. 6 is another view similar to FIG. 4, depicting still another annular pad larger in an outer diameter than the annular pad depicted in FIG. 5.
Figure 7:
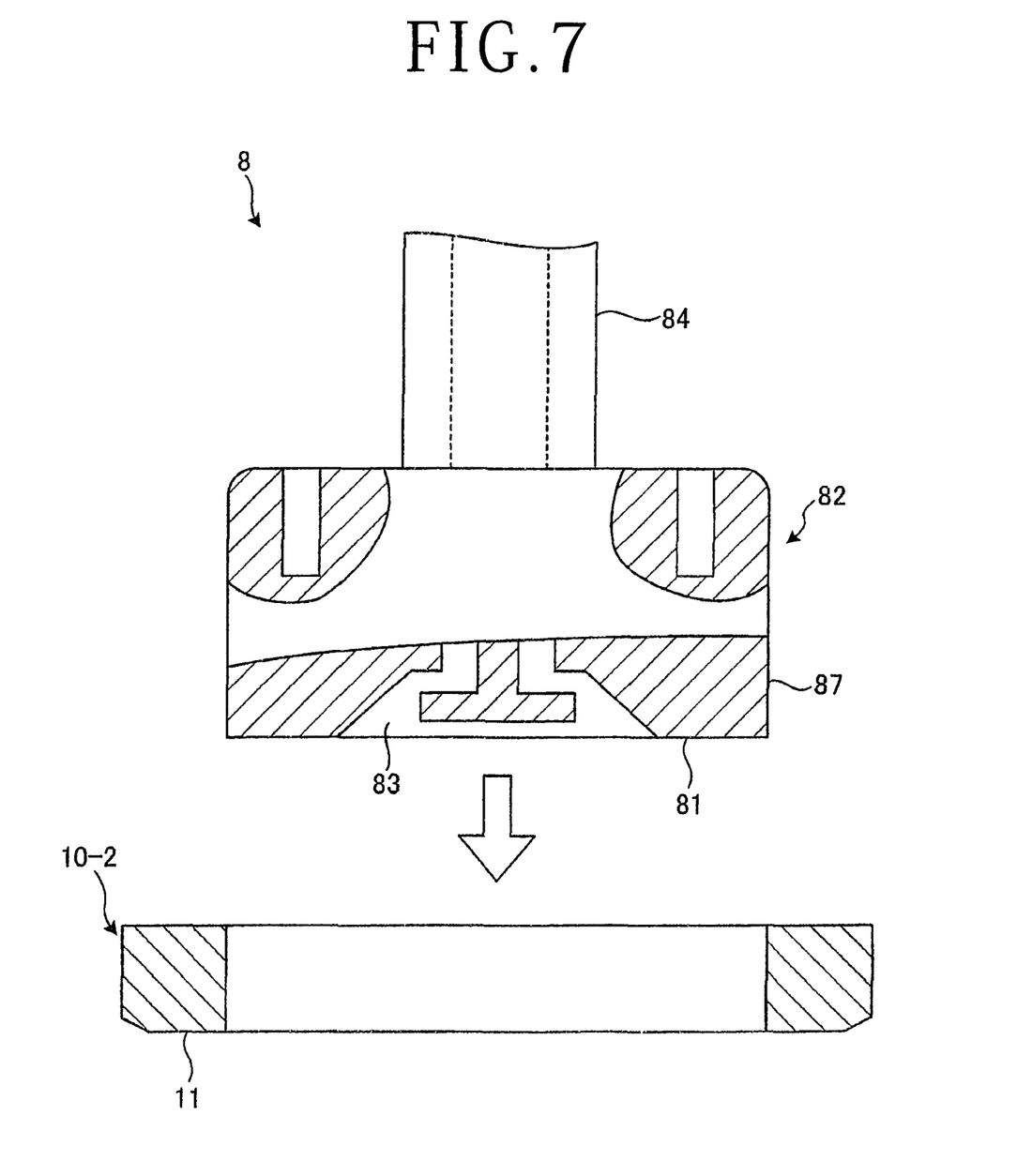
FIG. 7 is a sectional view depicting a condition before mounting the annular pad depicted in FIG. 5 to the pad body of the Bernoulli transfer pad.
Figure 8:
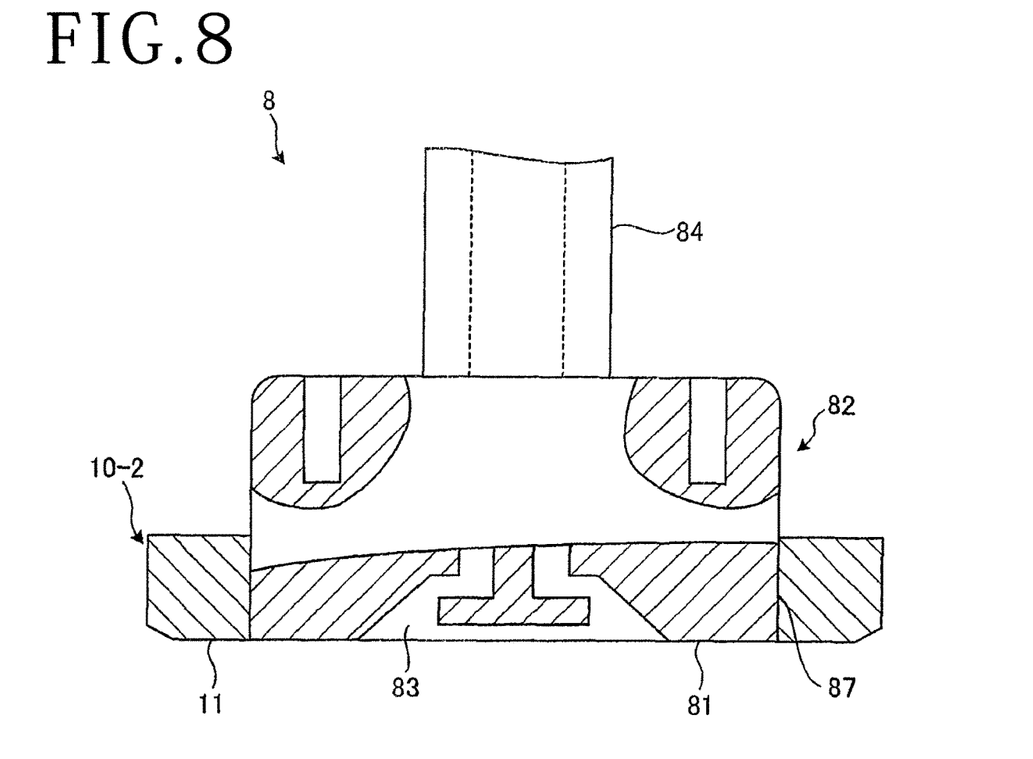
FIG. 8 is a sectional view depicting a condition that the annular pad depicted in FIG. 7 has been mounted to the pad body.
Figure 9:
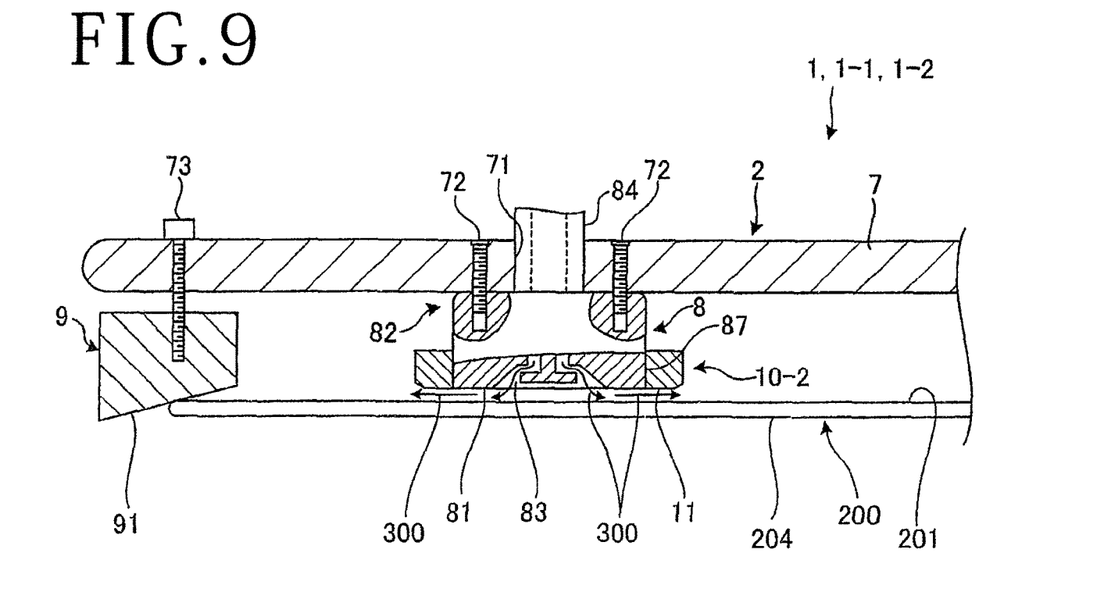
FIG. 9 is a sectional view of an essential part of the transfer apparatus depicted in FIG. 2 in a condition where the annular pad depicted in FIG. 7 is mounted on the pad body of the Bernoulli transfer pad and the workpiece is held under suction in a noncontact condition by the transfer apparatus.

In this preferred embodiment, various annular pads 10-1, 10-2, and 10-3 having different outer diameters as depicted in FIGS. 4, 5, and 6 are selectively mounted to the pad body 82 of each Bernoulli transfer pad 8. FIG. 4 is a sectional view of the annular pad 10-1 adapted to be mounted to the pad body 82 of each Bernoulli transfer pad 8. FIG. 5 is a sectional view of the annular pad 10-2 adapted to be mounted to the pad body 82 of each Bernoulli transfer pad 8. FIG. 6 is a sectional view of the annular pad 10-3 adapted to be mounted to the pad body 82 of each Bernoulli transfer pad 8. FIG. 7 is a sectional view depicting a condition before mounting the annular pad 10-2 to the pad body 82 of each Bernoulli transfer pad 8. FIG. 8 is a sectional view depicting a condition that the annular pad 10-2 has been mounted to the pad body 82 of each Bernoulli transfer pad 8. FIG. 9 is a sectional view of an essential part of each transfer apparatus 1 in the condition where the workpiece 200 is held under suction in a noncontact condition by each Bernoulli transfer pad 8 with the annular pad 10-2 mounted to the pad body 82 as depicted in FIG. 8.

The pad body 82 of each Bernoulli transfer pad 8 has an annular pad mounting portion 87 for selectively mounting the annular pads 10-1, 10-2, and 10-3 depicted in FIGS. 4, 5, and 6. In this preferred embodiment, the annular pad mounting portion 87 is formed by a cylindrical outer surface of the pad body 82.

Each of the annular pads 10-1, 10-2, and 10-3 has an inner diameter equal to the outer diameter of the pad body 82. The annular pads 10-1, 10-2, and 10-3 have different outer diameters. As depicted in FIGS. 7 and 8, the annular pad 10-2 has an inside circular opening 12, and the pad body 82 is inserted into the inside circular opening 12 of the annular pad 10-2. Although not depicted in FIGS. 7 and 8, each of the other annular pads 10-1 and 10-3 has the same inside circular opening 12 for insertion of the pad body 82. Thus, a selected one of the annular pads 10-1, 10-2, and 10-3 is mounted to the pad body 82 of each Bernoulli transfer pad 8. Each of the annular pads 10-1, 10-2, and 10-3 is formed of metal (e.g., stainless steel) or synthetic resin. After mounting a selected one of the annular pads 10-1, 10-2, and 10-3 to the pad body 82, the selected annular pad 10-1, 10-2, or 10-3 is fixed to the pad body 82 by any method. For example, a plurality of screws may be used to fix the selected annular pad 10-1, 10-2, or 10-3 to the pad body 82.

Each of the annular pads 10-1, 10-2, and 10-3 has a lower surface 11 as a second holding surface. The lower surface 11 is also a flat surface. When the selected annular pad 10-1, 10-2, or 10-3 is mounted to the pad body 82 of each Bernoulli transfer pad 8, the lower surface 11 becomes parallel to a horizontal direction. That is, when the selected annular pad 10-1, 10-2, or 10-3 is mounted to the pad body 82 of each Bernoulli transfer pad 8, the lower surface 11 of the selected annular pad 10-1, 10-2, or 10-3 becomes flush with the lower surface 81 of the pad body 82 as depicted in FIGS. 8 and 9. Accordingly, the lower surface 81 (the first holding surface) of the pad body 82 can be radially extended by the lower surface 11 (the second holding surface) of the selected annular pad 10-1, 10-2, or 10-3. As a result, an increased vacuum can be produced by the air 300 flowing between the sum of the lower surface 81 and the lower surface 11 and the workpiece 200, so that a suction force for sucking the workpiece 200 toward the pad body 82 can be increased.

The annular pads 10-1, 10-2, and 10-3 depicted in FIGS. 4, 5, and 6 are merely illustrative and any other annular pads may be used in the present invention. In this preferred embodiment, any one of the annular pads 10-1, 10-2, and 10-3 is selected according to the weight of the workpiece 200. Further, none of the annular pads 10-1, 10-2, and 10-3 may be used in some case.

As described above, the pad body 82 of each Bernoulli transfer pad 8 has the annular pad mounting portion 87 formed by the cylindrical outer surface of the pad body 82. That is, by suitably selecting any one of the annular pads 10-1, 10-2, and 10-3 and then mounting the selected annular pad 10-1, 10-2, or 10-3 to the annular pad mounting portion 87 of the pad body 82, the suction force of each Bernoulli transfer pad 8 can be easily improved or changed. As a result, the suction force for holding the workpiece 200 by using each Bernoulli transfer pad 8 can be adjusted according to the weight of the workpiece 200 as an object to be transferred, so that a cost and time for changing the suction force of each Bernoulli transfer pad 8 can be suppressed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A transfer system for holding a workpiece under suction in a noncontact condition and transferring the workpiece, the transfer system comprising:
    a base;
    a Bernoulli transfer pad fixed to said base for spraying a fluid toward the workpiece to produce a vacuum; and
    a moving unit for moving said base;
    said Bernoulli transfer pad including a cylindrical pad body, said pad body having a first holding surface to which a fluid spraying portion opens and a mounting portion; and
    an annular pad having a bottom surface and being mounted to said mounting portion of said pad body, wherein when said annular pad is mounted on said mounting portion, said first holding surface is flush with said bottom surface of said annular pad and is increased in a radial direction of said pad body to thereby increase a suction force for sucking the workpiece.

2. The transfer system according to claim 1, wherein said mounting portion is formed by a cylindrical outer surface of said pad body; and
    said annular pad has an inner diameter equal to a diameter of said pad body and wherein said bottom surface is flush with said first holding surface on a radially outside of said pad body.

3. The transfer system according to claim 2, wherein said annular pad includes a plurality of annular pads having different outer diameters; and
    a selected one of said plurality of annular pads is mounted on the cylindrical outer surface of said pad body.

4. The transfer system according to claim 1, further comprising a plurality of Bernoulli transfer pads fixed to said base, said plurality of Bernoulli transfer pads being arranged at equal intervals in a circumferential direction on said base.

5. The transfer system according to claim 1, further comprising at least one edge support member fixed to said base and configured to contact an outer edge of the workpiece.

* * * * *